(12) United States Patent
Li et al.

(10) Patent No.: US 12,519,428 B2
(45) Date of Patent: Jan. 6, 2026

(54) RADIO FREQUENCY POWER AMPLIFIER, RADIO FREQUENCY FRONT-END MODULE, AND COMMUNICATION TERMINAL

(71) Applicant: VANCHIP (TIANJIN) TECHNOLOGY CO., LTD., Tianjin (CN)

(72) Inventors: Hao Li, Tianjin (CN); Yunfang Bai, Tianjin (CN)

(73) Assignee: VANCHIP (TIANJIN) TECHNOLOGY CO., LTD., Tianjin (CN)

( * ) Notice: Subject to any disclaimer, the term of this patent is extended or adjusted under 35 U.S.C. 154(b) by 503 days.

(21) Appl. No.: 18/061,479

(22) Filed: Dec. 5, 2022

(65) Prior Publication Data

US 2023/0105134 A1    Apr. 6, 2023

Related U.S. Application Data

(63) Continuation of application No. PCT/CN2021/097837, filed on Jun. 2, 2021.

(30) Foreign Application Priority Data

Jun. 3, 2020  (CN) .......................... 202010492838.2

(51) Int. Cl.
| | | |
|---|---|---|
| *H03F 1/32* | (2006.01) | |
| *H03F 3/24* | (2006.01) | |
| *H03G 3/30* | (2006.01) | |

(52) U.S. Cl.
CPC ............... *H03F 1/32* (2013.01); *H03F 3/245* (2013.01); *H03G 3/3042* (2013.01);
(Continued)

(58) Field of Classification Search
CPC ...... H03F 1/32; H03F 3/245; H03F 2200/451; H03G 3/3042; H03G 2201/103; H03G 2201/307
(Continued)

(56) References Cited

U.S. PATENT DOCUMENTS 5,673,001 A *  9/1997  Kim ..................... H03G 3/3042
                                                      330/145
7,301,402 B2 * 11/2007  Norris ....................... H03F 1/32
                                                      330/298
(Continued)

OTHER PUBLICATIONS

Giry et al. "A monolithic watt-level SOI LDMOS linear power amplifier with through silicon via for 4G cellular applications", 2013 IEEE Topical Conference on Power Amplifiers for Wireless and Radio Applications, 2013 (Year: 2013).*

*Primary Examiner* — Hafizur Rahman
(74) *Attorney, Agent, or Firm* — George Guosheng Wang; Upstream Research and Patent LLC

(57) ABSTRACT

Disclosed in the present invention are a radio frequency power amplifier, a radio frequency front-end module, and a communication terminal. The power amplifier includes a control unit, a power amplification unit, a detection and comparison unit, and a gain adjustment unit. According to a function relationship between the gain of the power amplification unit and the output power of the power amplification unit in different frequency bands and different power level modes, the control unit adjusts a function relationship between an adjustment current generated by the gain adjustment unit and a bias current of the power amplification unit; then the detection and comparison unit compares the bias current, of the power amplification unit with a reference current; according to the comparison result, the control unit
(Continued)

controls whether the gain adjustment unit needs to generate an adjustment current and output the same to the power amplification unit.

10 Claims, 8 Drawing Sheets

(52) U.S. Cl.
CPC . *H03F 2200/451* (2013.01); *H03G 2201/103* (2013.01); *H03G 2201/307* (2013.01)

(58) Field of Classification Search
USPC .......................................................... 330/278
See application file for complete search history.

(56) References Cited

U.S. PATENT DOCUMENTS

| | | | |
|---|---|---|---|
| 8,183,925 B2 * | 5/2012 | Ohta | H03F 1/56 330/296 |
| 9,385,675 B2 * | 7/2016 | Liu | H03F 1/0266 |
| 12,301,172 B2 * | 5/2025 | Constantin | H03F 1/3247 |
| 2005/0032488 A1 * | 2/2005 | Pehlke | H03F 1/0222 455/127.1 |
| 2012/0094727 A1 * | 4/2012 | Morimoto | H03F 1/0261 455/571 |
| 2017/0230021 A1 * | 8/2017 | Goss | H03F 3/19 |
| 2018/0287578 A1 * | 10/2018 | Goss | H03F 3/21 |

* cited by examiner

RADIO FREQUENCY POWER AMPLIFIER, RADIO FREQUENCY FRONT-END MODULE, AND COMMUNICATION TERMINAL

BACKGROUND

Technical Field

The present invention relates to a radio frequency power amplifier, and also relates to a radio frequency front-end module including the radio frequency power amplifier and a corresponding communication terminal, which belong to the technical field of wireless communications.

Related Art

With the progress of science and technology, the Wifi communication standard has experienced IEEE 802.11-1997, IEEE 802.11a, 802.11b, 802.11g, 802.11n, and 802.11ac to IEEE 802.11ax. Also, the mobile communication technology has experienced 2G and 3G, the 4G mobile communication technology is being widely applied, and the 5G mobile communication technology will be actively deployed in the future. A radio frequency front-end linearity is highly required for the development of Wifi communications and mobile communications. Therefore, there is a need for manufacturers of communication devices to design communication devices with high linearity.

A radio frequency front-end module is an important radio frequency component which cannot be integrated by a transceiver in a current wireless communication terminal. In the radio frequency front-end module, a modulated radio frequency signal is amplified to a certain power value by a power amplifier, and then the amplified radio frequency signal is transmitted out by an antenna.

However, as the output power of the power amplifier of the conventional radio frequency front-end module increases, the gain of the radio frequency front-end module will be gradually reduced, thereby affecting the linearity index thereof. In order to solve this problem, a linearization bias technology is typically employed in a bias circuit of the power amplifier. However, for broadband radio frequency front-end modules, the adaptive bias circuit is difficult to adapt to broadband frequency requirements. Also, the gain at different powers is not very flexibly adjusted, and therefore the linearity of the radio frequency front-end module cannot be well optimized at different powers.

SUMMARY

The primary technical problem to be solved by the present invention is to provide a radio frequency power amplifier.

Another technical problem to be solved by the present invention is to provide a radio frequency front-end module including the radio frequency power amplifier and a corresponding communication terminal.

To achieve the foregoing purpose, the following technical solutions are used in the present invention: According to a first aspect of an embodiment of the present invention, there is provided a radio frequency power amplifier including a control unit, a power amplification unit, a detection and comparison unit, and a gain adjustment unit. An output end of the control unit is connected to input ends of the detection and comparison unit and the gain adjustment unit, a detection end of the power amplification unit is connected to the input end of the detection and comparison unit, an output end of the detection and comparison unit is connected to an input end of the control unit, and an output end of the gain adjustment unit is connected to a bias end of the power amplification unit.

The control unit controls whether the gain adjustment unit needs to generate an adjustment current and output the same to the power amplification unit according to a comparison result between a reference current and a bias current, which is detected by the detection and comparison unit in real time, of the power amplification unit, so as to ensure that the gain of the power amplification unit operating at different powers is not changed.

Preferably, the control unit controls the gain adjustment unit to generate an adjustment current and output the same to the power amplification unit when the bias current of the power amplification unit is greater than the reference current, so as to ensure that the gain of the power amplification unit operating at different powers is not changed.

The control unit controls the gain adjustment unit to stop outputting an adjustment current to the power amplification unit when the bias current of the power amplification unit is smaller than the reference current.

Preferably, the power amplification unit includes at least one stage of amplification circuit, each stage of amplification circuit is connected to a first bias circuit respectively, the first bias circuit of any stage of amplification circuit is connected to the input end of the detection and comparison unit, and the output end of the detection and comparison unit is connected to a bias end of any stage of amplification circuit adjacent to this stage of amplification circuit through the gain adjustment unit controlled by the control unit.

Preferably, when the power amplification unit includes more than two stages of amplification circuits, the various stages of amplification circuits are connected through an inter-stage matching circuit, an input end of the first stage of amplification circuit is connected to an output end of an input matching unit, and the last stage of amplification circuit is impedance-matched with an external antenna through an output matching circuit.

Preferably, the detection and comparison unit includes a current acquisition circuit, a current magnitude comparison circuit, and a reference current generation circuit, an input end of the current acquisition circuit is connected to the bias circuit of any stage of amplification circuit, output ends of the current acquisition circuit and the reference current generation circuit are connected to an input end of the current magnitude comparison circuit, an output end of the current magnitude comparison circuit is connected to the input end of the control unit, and the output end of the control unit is connected to an input end of the reference current generation circuit.

Preferably, the gain adjustment unit includes a bias current generation circuit.

When the power amplification unit includes one stage of amplification circuit, an input end of the bias current generation circuit is connected to the control unit, and an output end of the bias current generation circuit is connected to a bias end of an amplification circuit to be detected.

When the power amplification unit includes more than two stages of amplification circuits, the input end of the bias current generation circuit is connected to the control unit, and the output end of the bias current generation circuit is connected to a bias end of any stage of amplification circuit adjacent to the amplification circuit to be detected.

Preferably, the gain adjustment unit includes a bias current generation circuit and a second bias circuit.

When the power amplification unit includes one stage of amplification circuit, an input end of the bias current generation circuit is connected to the control unit, an output end of the bias current generation circuit is connected to an input end of the second bias circuit, and an output end of the second bias circuit is connected to a bias end of this stage of amplification circuit.

When the power amplification unit includes more than two stages of amplification circuits, the input end of the bias current generation circuit is connected to the control unit, the output end of the bias current generation circuit is connected to the input end of the second bias circuit, and the output end of the second bias circuit is connected to a bias end of any stage of amplification circuit adjacent to the amplification circuit to be detected.

Preferably, the gain adjustment unit includes a bias current generation circuit and a third resistor.

When the power amplification unit includes one stage of amplification circuit, an input end of the bias current generation circuit is connected to the control unit, an output end of the bias current generation circuit is connected to one end of the third resistor, and the other end of the third resistor is connected to a bias end of this stage of amplification circuit.

When the power amplification unit includes more than two stages of amplification circuits, the input end of the bias current generation circuit is connected to the control unit, the output end of the bias current generation circuit is connected to one end of the third resistor, and the other end of the third resistor is connected to a bias end of any stage of amplification circuit adjacent to the amplification circuit to be detected.

Preferably, the radio frequency power amplifier further includes a power supply unit, an input end of the power supply unit is connected to the output end of the control unit, and an output end of the power supply unit is connected to a power supply end of the power amplification unit.

According to a second aspect of an embodiment of the present invention, there is provided a radio frequency front-end module including the above-mentioned radio frequency power amplifier.

According to a third aspect of an embodiment of the present invention, there is provided a communication terminal including the above-mentioned radio frequency power amplifier.

In the radio frequency power amplifier provided by the present invention, according to a function relationship between the gain of the power amplification unit and the output power of the power amplification unit in different frequency bands and different power level modes, the control unit adjusts a function relationship between an adjustment current generated by the gain adjustment unit and a bias current of the power amplification unit; then the detection and comparison unit compares the bias current, which is detected in real time, of the power amplification unit with a reference current; according to the comparison result, the control unit controls whether the gain adjustment unit needs to generate an adjustment current and output the same to the power amplification unit; thus, gain compensation of the power amplification unit in different modes is flexibly and effectively implemented, and the linearity index of a radio frequency front-end module is improved.

DETAILED DESCRIPTION

Technical contents of the present invention are further described in detail below with reference to the accompanying drawings and specific embodiments.

Figure 1:
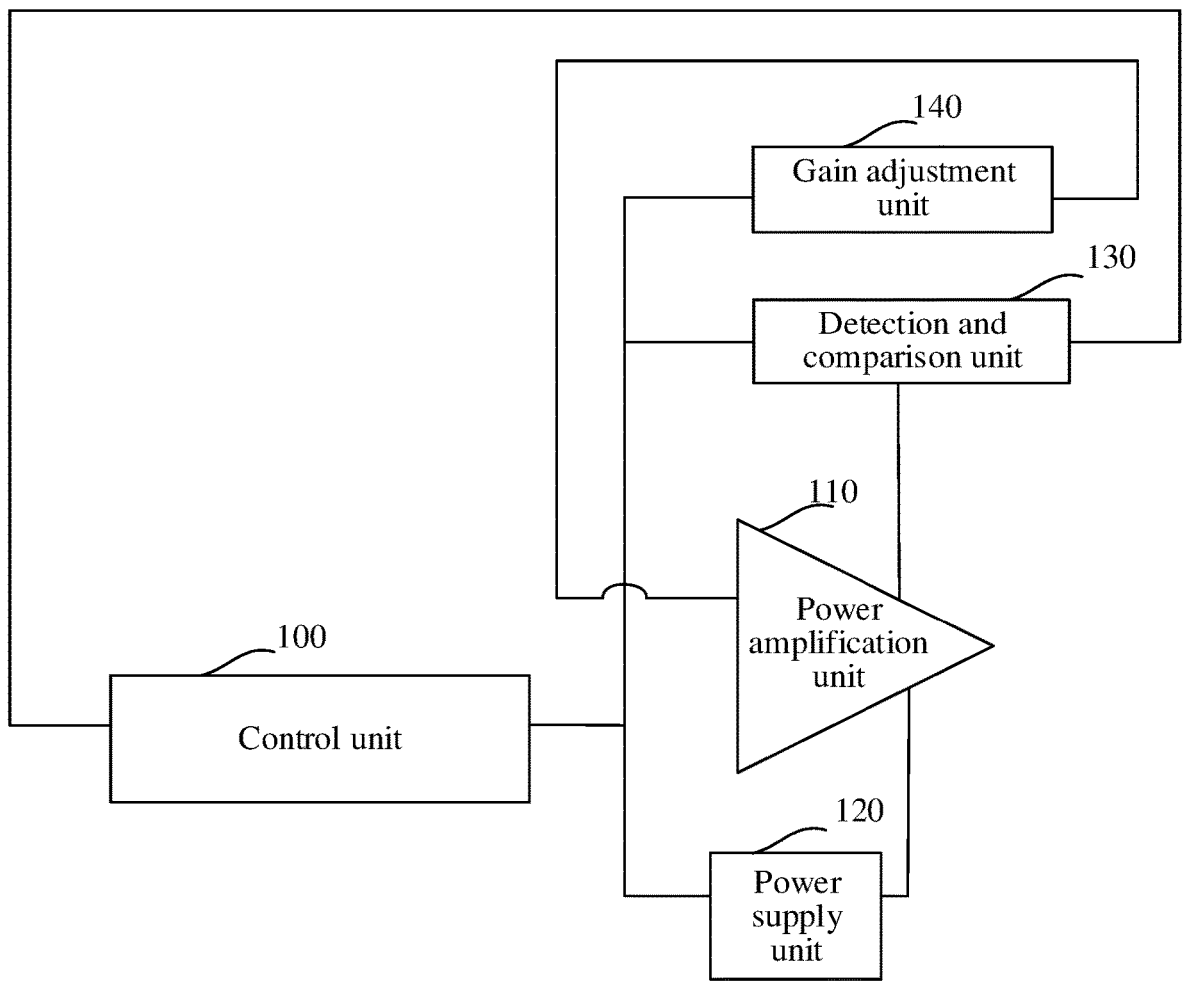
FIG. 1 is a schematic structural diagram of a radio frequency power amplifier according to the present invention.

In order to solve the problem that the linearity of a radio frequency front-end module cannot be well optimized due to the inflexible gain adjustment of a radio frequency power amplifier at different powers, as shown in FIG. 1, an embodiment of the present invention provides a newly-designed radio frequency power amplifier, including a control unit 100, a power amplification unit 110, a power supply unit 120, a detection and comparison unit 130, and a gain adjustment unit 140. An output end of the control unit 100 is connected to input ends of the detection and comparison unit, the gain adjustment unit 140, and the power supply unit 120. A detection end of the power amplification unit 110 is connected to the input end of the detection and comparison unit 130. An output end of the detection and comparison unit 130 is connected to an input end of the control unit 100. An output end of the gain adjustment unit 140 is connected to a bias end of the power amplification unit 110. A power supply end of the power amplification unit 110 is connected to an output end of the power supply unit 120.

Figure 2:
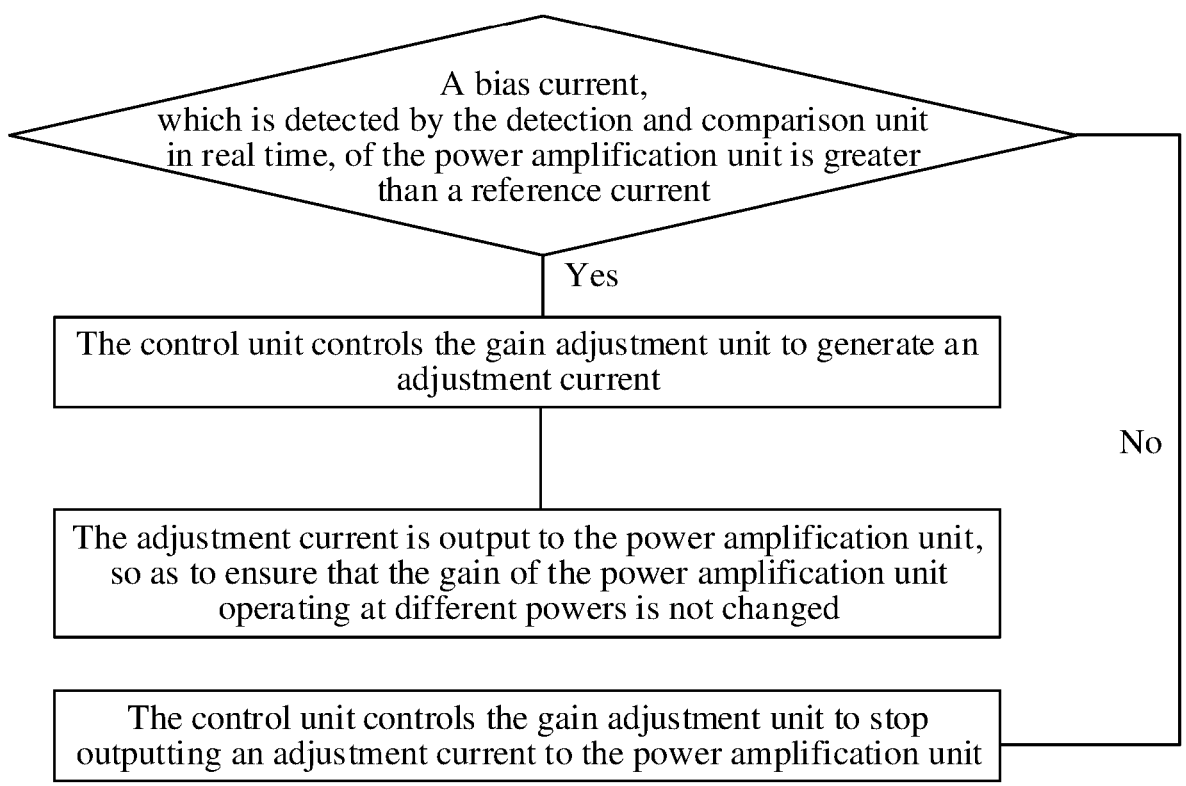
FIG. 2 is an operating principle flowchart of a radio frequency power amplifier according to the present invention.

The control unit 100 controls whether the gain adjustment unit 140 needs to generate an adjustment current and output the same to the power amplification unit 110 according to a comparison result between a reference current and a bias current, which is detected by the detection and comparison unit 130 in real time, of the power amplification unit 110, so as to ensure that the gain of the power amplification unit 110 operating at different powers is not changed, thereby ensuring the optimal linearity of a radio frequency front-end module. Specifically, as shown in FIG. 2, the control unit 100 controls the gain adjustment unit 140 to generate an adjustment current and output the same to the power amplification unit 110 when the bias current, which is detected by the detection and comparison unit 130 in real time, of the power amplification unit 110 is greater than the reference current, so as to ensure that the gain of the power amplification unit 110 operating at different powers is not changed, and the control unit 100 controls the gain adjustment unit 140 to stop outputting an adjustment current to the power amplification unit 110 when the bias current, which is detected by the detection and comparison unit 130 in real time, of the power amplification unit 110 is smaller than the reference current.

The control unit 100 may be implemented using a central processing unit in a communication terminal. The control unit 100 may control the operating state of the power supply unit 120, and the magnitudes of a power supply voltage and current generated and output during operation. The adjustment of a function relationship between an adjustment current generated by the gain adjustment unit 140 and a bias current of the power amplification unit 110 may also be controlled according to a function relationship in an application where the gain of the power amplification unit 110 is reduced as the output power thereof increases.

The power amplification unit 110 is configured to amplify the modulated radio frequency signal to a preset power value. The power amplification unit 110 includes at least one stage of amplification circuits, each stage of amplification circuit is connected to a first bias circuit respectively, the first bias circuit of any stage of amplification circuit is connected to the input end of the detection and comparison unit 130, the output end of the detection and comparison unit 130 is connected to a bias end of any stage of amplification circuit adjacent to this stage of amplification circuit through the gain adjustment unit 140, and the bias end of this stage of amplification circuit serves as a detection end of the power amplification unit 110.

If the power amplification unit 110 has only one stage of amplification circuit, this stage of amplification circuit is impedance-matched with an external antenna through an output matching circuit, a first bias circuit of this stage of amplification circuit is connected to the input end of the detection and comparison unit 130, the output end of the detection and comparison unit 130 is connected to a bias end of this stage of amplification circuit through the gain adjustment unit 140, and the bias end of this stage of amplification circuit also serves as a detection end of the power amplification unit 110.

If the power amplification unit 110 includes more than two stages of amplification circuits (two stages, similarly hereinafter), the various stages of amplification circuits are connected through an inter-stage matching circuit, and the last stage of amplification circuit is impedance-matched with an external antenna through an output matching circuit. A first bias circuit of any stage of amplification circuit is connected to the input end of the detection and comparison unit 130, and the output end of the detection and comparison unit 130 is connected to a bias end of any stage of amplification circuit adjacent to this stage of amplification circuit through the gain adjustment unit 140.

Figure 3:
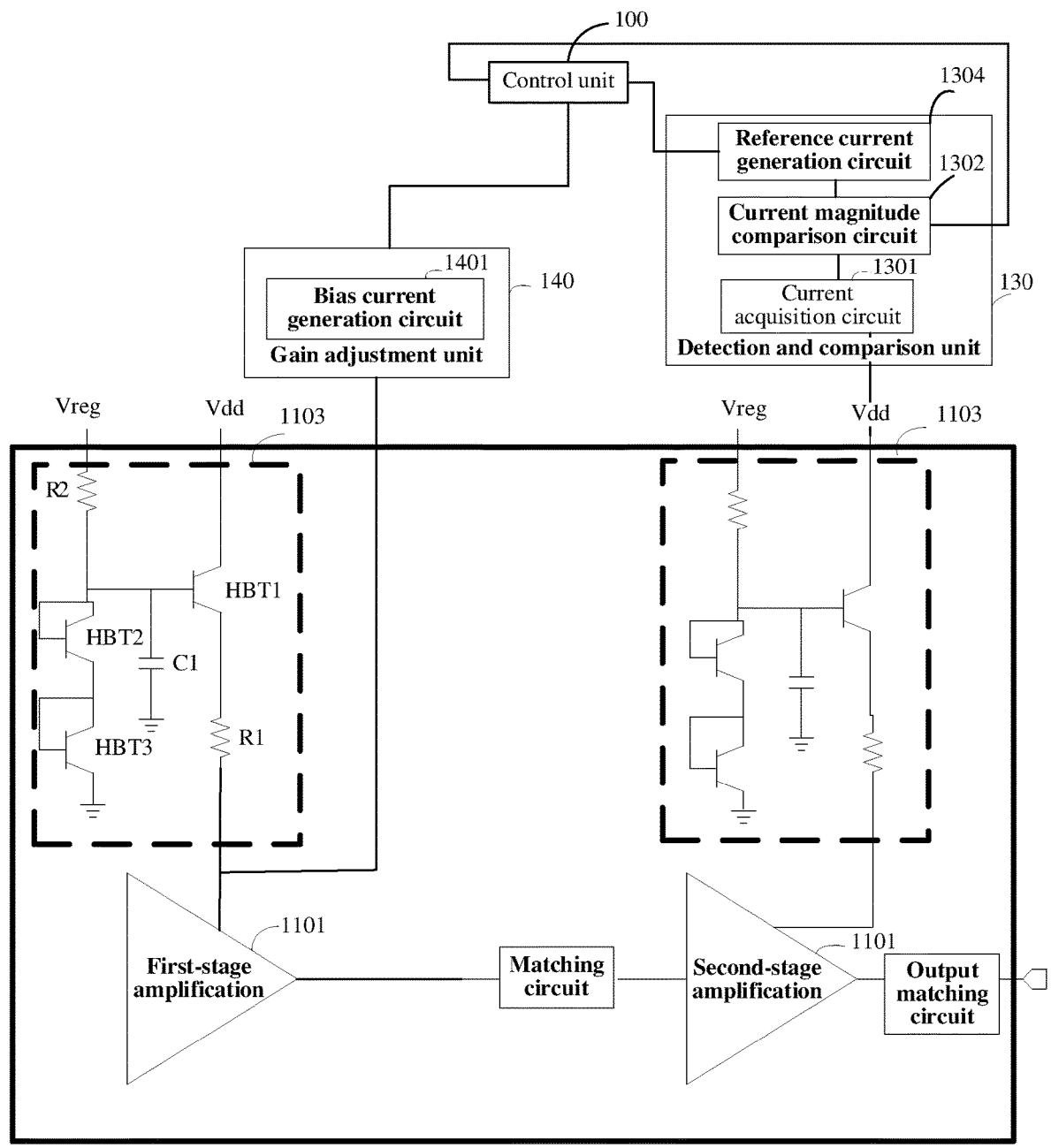
FIG. 3 is a schematic structural diagram of a first gain adjustment unit combined with a power amplification unit and a detection and comparison unit in a radio frequency power amplifier according to the present invention.

As shown in FIG. 3, the power amplification unit 110 includes, for example, two stages of amplification circuits 1101. The first stage of amplification circuit and the second stage of amplification circuit are connected through an inter-stage matching circuit, and the second stage of amplification circuit is impedance-matched with an external antenna through an output matching circuit. Each stage of amplification circuit 1101, the inter-stage matching circuit and the output matching circuit are conventional circuits and will not be described in detail herein.

The first bias circuit is configured to provide a bias voltage and a bias current for the corresponding amplification circuit. As shown in FIG. 3, two stages of amplification circuits are included for example. The first stage of amplification circuit and the second stage of amplification circuit are connected to a first bias circuit 1103 respectively. Each first bias circuit 1103 includes a first transistor HBT1, a second transistor HBT2, a third transistor HBT3, a capacitor C1, a first resistor R1, and a second resistor R2. A connection relationship between various parts of the first bias circuit 1103 is as follows. A collector of the first transistor HBT1 is connected to a power supply voltage Vdd. An emitter of the first transistor HBT1 is connected to a bias end of a corresponding amplification circuit through the first resistor R1. A base of the first transistor HBT1 is connected to one end of the capacitor C1, a collector of the second transistor HBT2 and one end of the second resistor R2 respectively. The other end of the capacitor C1 is grounded. The collector of the second transistor HBT2 is connected to a base thereof. The other end of the second resistor R2 is connected to a bias voltage Vreg. An emitter of the second transistor HBT2 is connected to a base and a collector of the third transistor HBT3. An emitter of the third transistor HBT3 is grounded.

The power supply unit 120 is configured to provide a required bias voltage and operating current for the power amplification unit 110. The power supply unit 120 is implemented using a linear regulated power supply.

As shown in FIG. 3, the detection and comparison unit 130 includes a current acquisition circuit 1301, a current magnitude comparison circuit 1302, and a reference current generation circuit 1304. An input end of the current acquisition circuit 1301 is connected to a bias circuit of any stage of amplification circuit. Output ends of the current acquisition circuit 1301 and the reference current generation circuit 1304 are connected to an input end of the current magnitude comparison circuit 1302. An output end of the current magnitude comparison circuit 1302 is connected to the input end of the control unit 100. The output end of the control unit 100 is connected to an input end of the reference current generation circuit 1304. The current acquisition circuit 1301, the current magnitude comparison circuit 1302, and the reference current generation circuit 1304 are conventional circuits, and the results of each circuit are not described in detail.

The operation principle of the detection and comparison unit 130 is: firstly, according to a practical application scenario, the control unit 100 controls the magnitude of a reference current generated by the reference current generation circuit 1304. For example, the reference current is large in a high-power application scenario and is small in a low-power application scenario. The reference current is output to the current magnitude comparison circuit 1302. Then the current acquisition circuit 1301 outputs a bias current, which is detected in real time, of a certain stage of amplification circuit in the power amplification unit 110 to the current magnitude comparison circuit 1302, and the current acquisition circuit 1301 compares the bias current of the power amplification unit 110 with a reference current, and feeds back a comparison result to the control unit 100, whereby the control unit 100 controls whether the gain adjustment unit 140 needs to generate an adjustment current and output the same to the power amplification unit 110 according to the comparison result, so as to ensure that the gain of the power amplification unit 110 operating at different powers is not changed, thereby ensuring the optimal linearity of a radio frequency front-end module.

As shown in FIG. 3, in one embodiment of the present invention, the gain adjustment unit 140 includes a bias current generation circuit 1401. An input end of the bias current generation circuit 1401 is connected to the control unit 100, and an output end of the bias current generation circuit 1401 is connected to a bias end of any stage of amplification circuit adjacent to an amplification circuit to be detected. Alternatively, the output end of the bias current generation circuit 1401 is connected to the bias end of the amplification circuit to be detected (in the case of only one amplification circuit).

Figure 6:
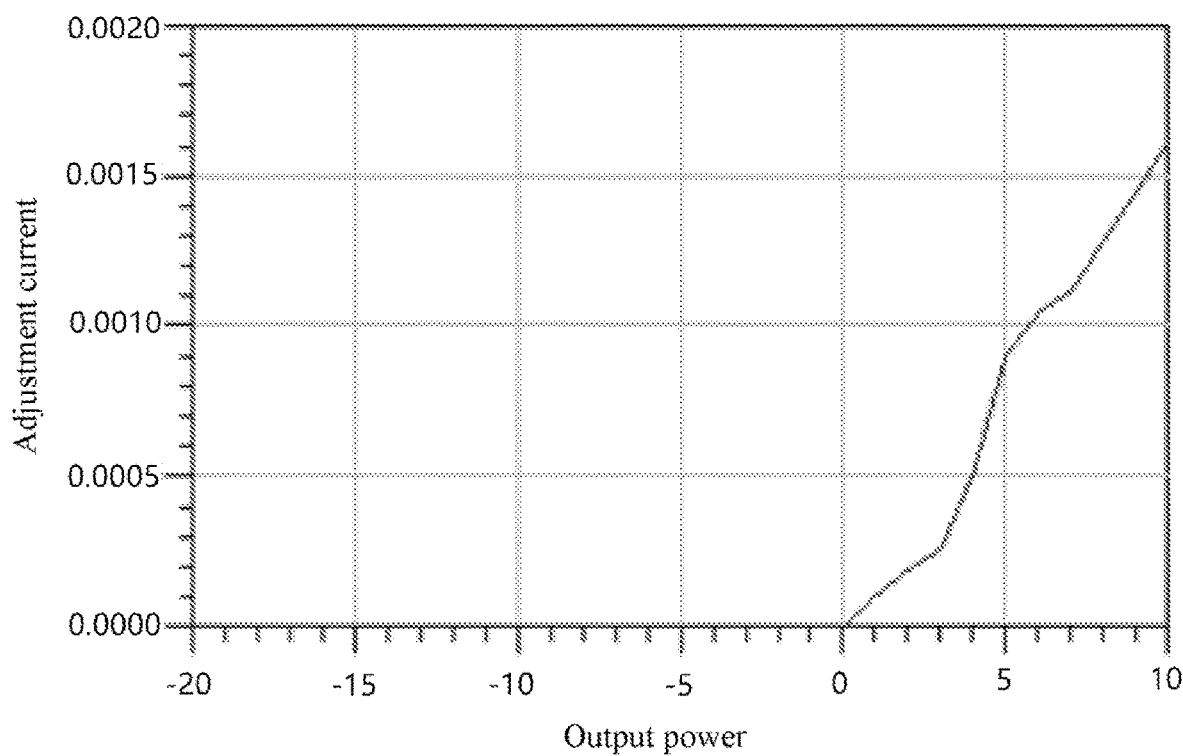
FIG. 6 is a schematic diagram of a change curve of an adjustment current with the output power of a power amplification unit in a radio frequency power amplifier according to the present invention.

Specifically, when the bias current, which is detected by the detection and comparison unit 130 in real time, of the power amplification unit 110 is greater than the reference current, the control unit 100 controls the bias current generation circuit 1401 to operate so as to generate an adjustment current (an adjustment current is output from the second half of FIG. 6). The adjustment current is output to the corresponding amplification circuit so as to increase the gain of the power amplification unit 110, thereby compensating for the problem that the gain of the power amplification unit 110 is reduced as the output power of the power amplification unit 110 increases, and ensuring that the gain of the power amplification unit 110 operating at different powers is unchanged, so as to achieve the purpose of optimal linearity of a radio frequency front-end module.

When the bias current, which is detected by the detection and comparison unit 130 in real time, of the power amplification unit 110 is smaller than the reference current, it indicates that the gain of the power amplification unit 110 meets the requirements, the control unit 100 controls the bias current generation circuit 1401 to stop operating, i.e. stop outputting the adjustment current to the power amplification unit 110 (no adjustment current is output from the first half of FIG. 6).

Hereinafter, the case where the bias current, which is detected by the detection and comparison unit 130 in real time, of the power amplification unit 110 is greater than the reference current will be described in detail.

As shown in FIG. 3, the power amplification unit 110 includes two stages of amplification circuits 1101, and the case where the current acquisition circuit 1301 detects a bias current of the second stage of amplification circuit is taken as an example. When the current acquisition circuit 1301 detects in real time that the bias current of a first transistor HBT1 corresponding to the second stage of amplification circuit is greater than the reference current, the control unit 100 controls the bias current generation circuit 1401 to operate so as to generate an adjustment current which is output to the first stage of amplification circuit so as to increase the gain of the power amplification unit 110.

Figure 7:
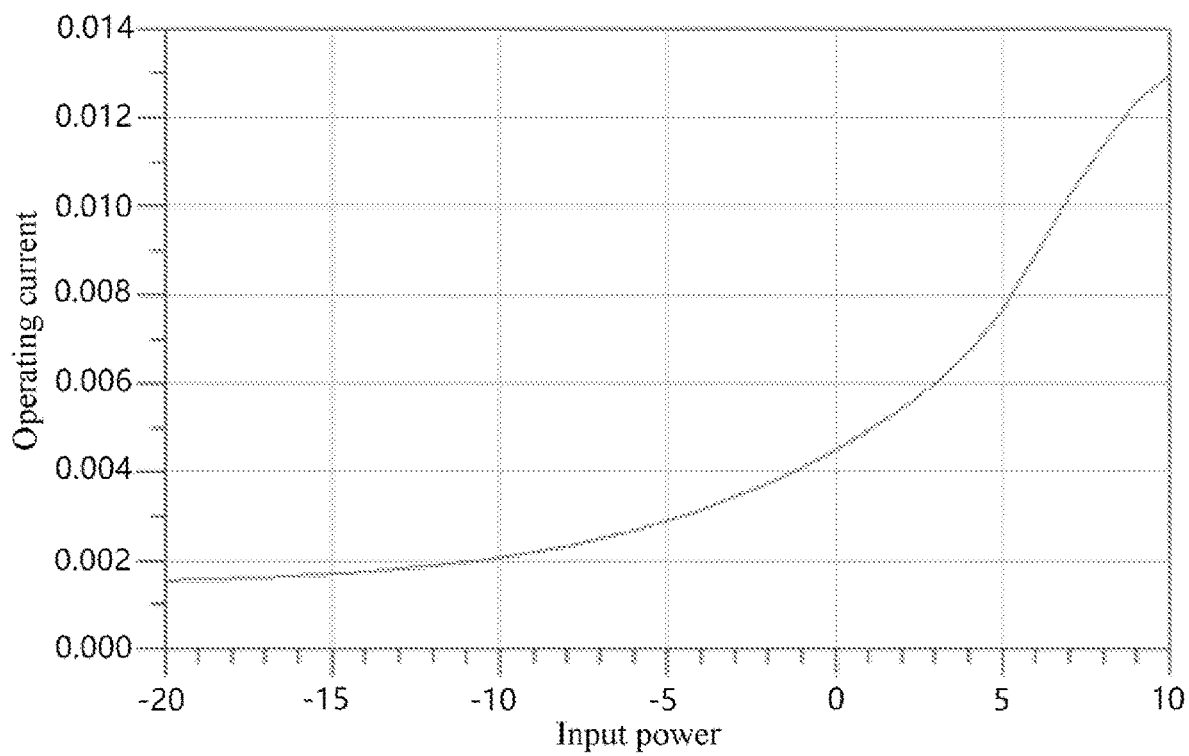
FIG. 7 is a schematic diagram of a change curve of a bias current of a power amplifier with the output power thereof in a radio frequency power amplifier according to the present invention.

Specifically, the current acquisition circuit 1301 detects a bias current of the first transistor HBT1 corresponding to the second stage of amplification circuit in real time, and the bias current increases as the input or output power of the power amplification unit 110 increases. For example, as shown in FIG. 7, the bias current of the second stage of amplification circuit increases with the increase of the input power of the power amplification unit 110, while the gain of the power amplification unit 110 is reduced with the increase of the output power thereof. Therefore, the bias current generation circuit 1401 may be used to generate an adjustment current and output the same to the first stage of amplification circuit. The magnitude of the adjustment current generated by the bias current generation circuit 1401 is positively correlated to the bias current of the first transistor HBT1 of the second stage of amplification circuit. The adjustment current generated by the bias current generation circuit 1401 is provided for the first stage of amplification circuit, such that the gain of the power amplification unit 110 can be increased, thereby compensating for the problem that the gain of the power amplification unit 110 is reduced as the output power of the power amplification unit 110 increases, and ensuring that the gain of the power amplification unit 110 operating at different powers is unchanged, so as to achieve the purpose of optimal linearity of a radio frequency front-end module.

Figure 8:
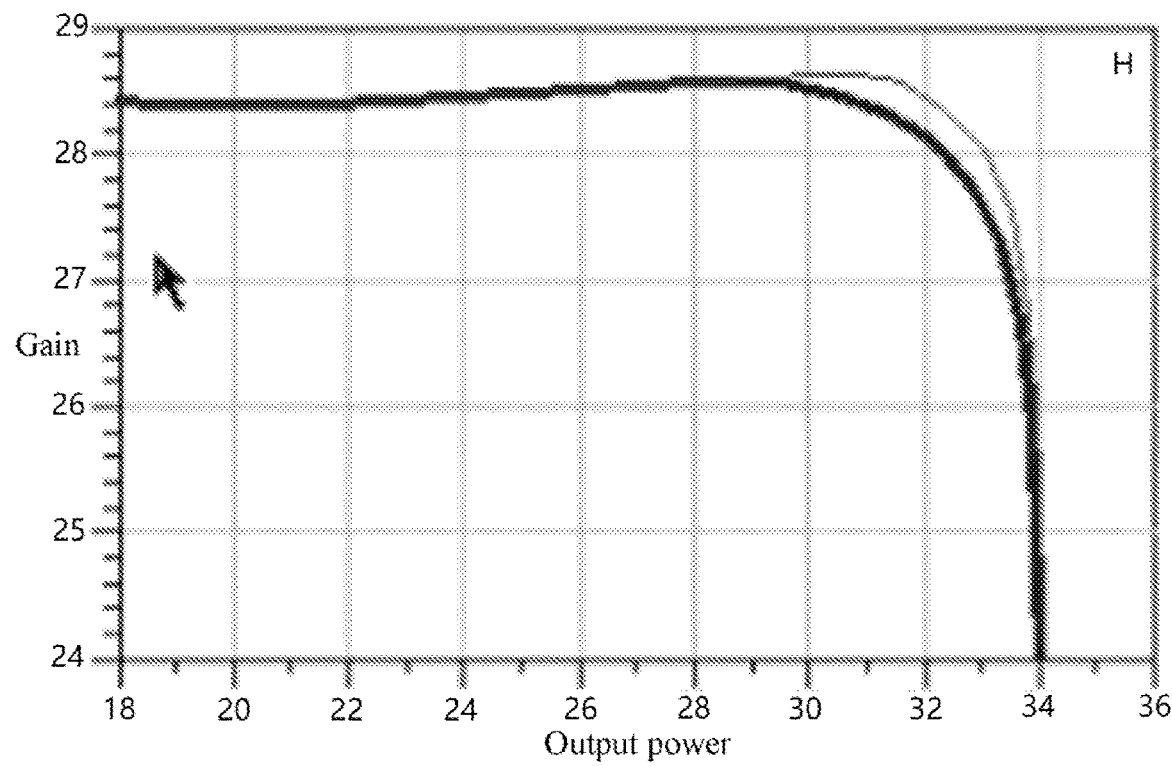
FIG. 8 is a schematic diagram of a change curve of the gain of a power amplification unit with the output power thereof when a radio frequency power amplifier according to the present invention is used and not used.
Figure 9:
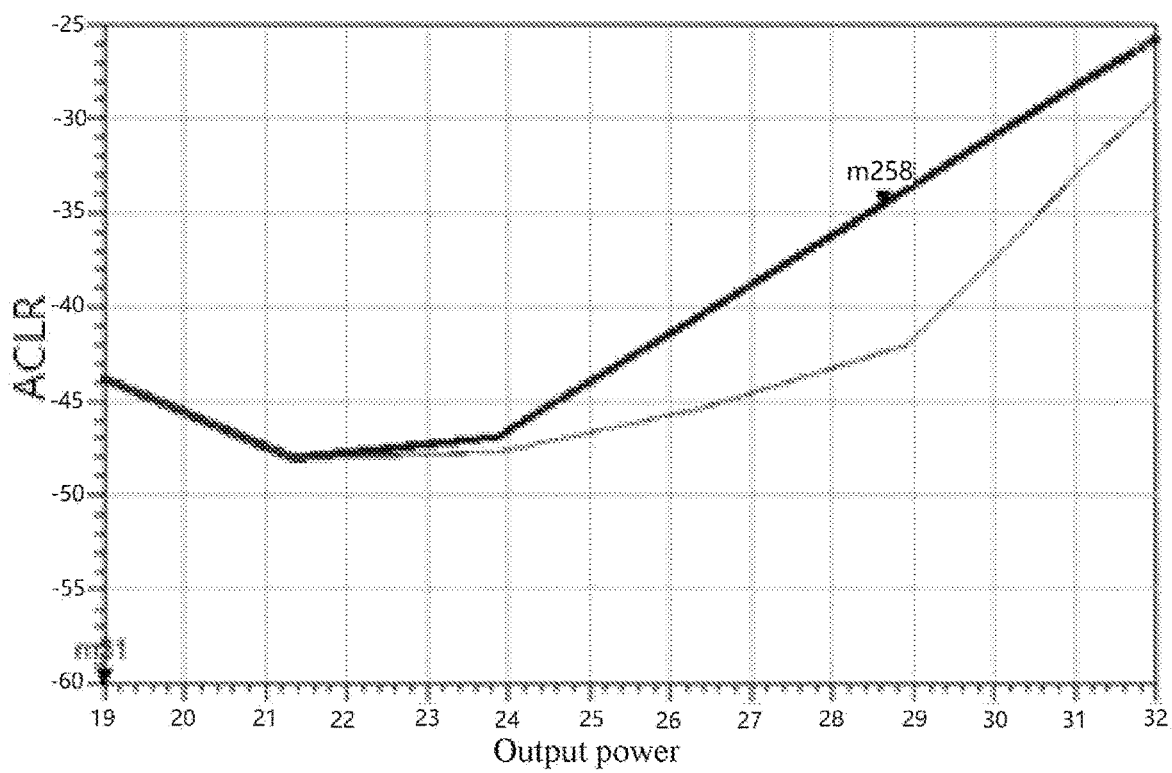
FIG. 9 is a schematic comparison diagram of a change curve of ACPR with the output power when a radio frequency power amplifier according to the present invention is used and not used.

As shown in FIG. 8, a thinner curve shows that as the output power of the radio frequency power amplifier increases in the presence of the radio frequency power amplifier, the gain of the power amplifier is not changed, so as to ensure the optimal linearity of the radio frequency front-end module. As shown in FIG. 9, ACPR is an index describing the linearity of the radio frequency power amplifier. The smaller ACPR indicates the better linearity of the radio frequency power amplifier. In FIG. 9, a thinner curve shows that as the output power of the radio frequency power amplifier increases in the presence of the radio frequency power amplifier, the linearity is significantly higher than the linearity shown by a thinner curve in the absence of the radio frequency power amplifier.

Figure 4:
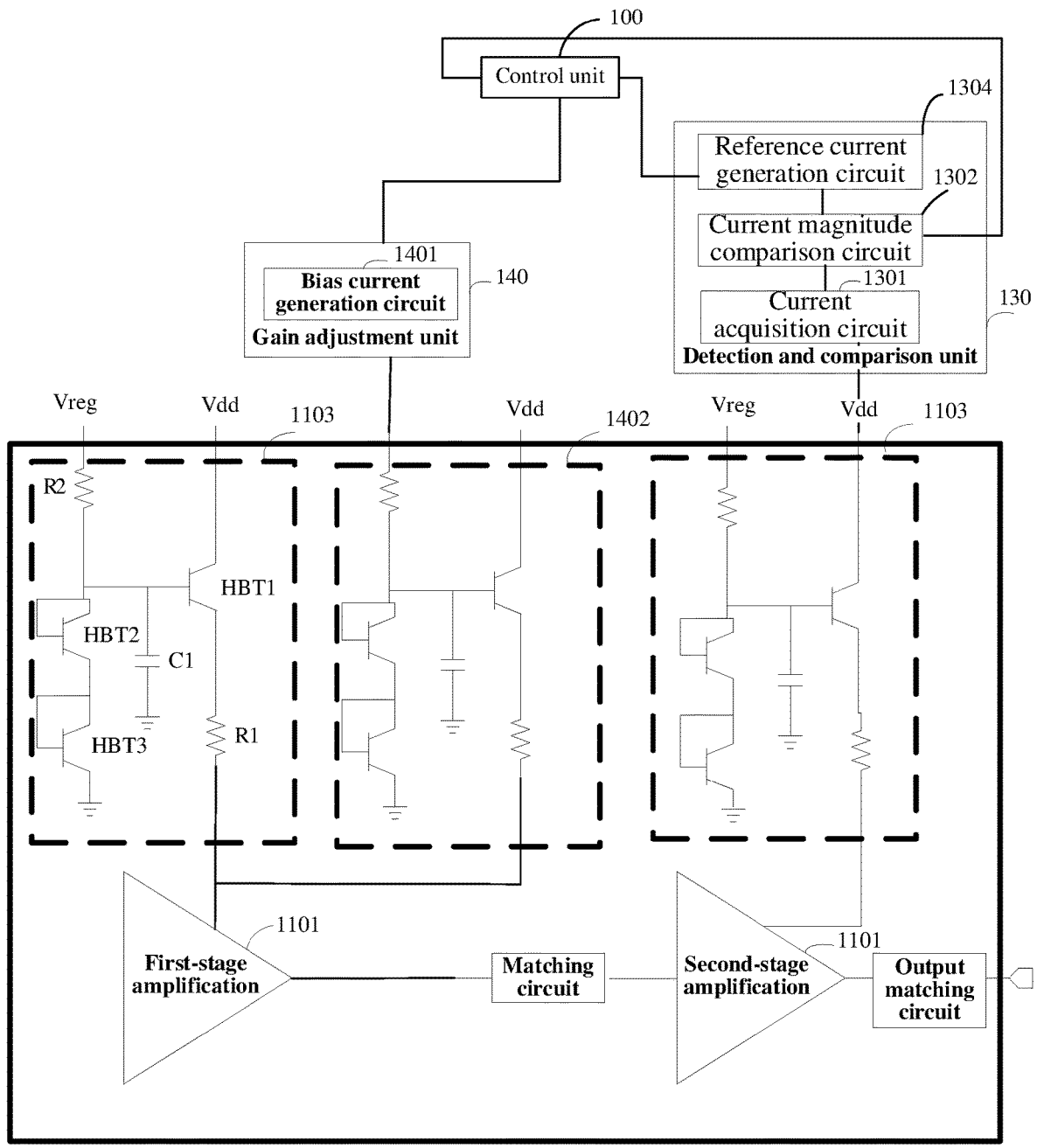
FIG. 4 is a schematic structural diagram of a second gain adjustment unit combined with a power amplification unit and a detection and comparison unit in a radio frequency power amplifier according to the present invention.

As shown in FIG. 4, in another embodiment of the present invention, the gain adjustment unit 140 includes a bias current generation circuit 1401 and a second bias circuit 1402. An input end of the bias current generation circuit 1401 is connected to the control unit 100, an output end of the bias current generation circuit 1401 is connected to an input end of the second bias circuit 1402, and an output end of the second bias circuit 1402 is connected to a bias end of any stage of amplification circuit adjacent to an amplification circuit to be detected. Alternatively, the output end of the second bias circuit 1402 is connected to the bias end of the amplification circuit to be detected (in the case of only one amplification circuit). The structure of the second bias circuit 1402 is the same as that of the first bias circuit, the other end of a second resistor of the second bias circuit 1402 serves as the input end of the second bias circuit 1402, and the other end of a first resistor of the second bias circuit 1402 serves as the output end of the second bias circuit 1402.

Specifically, when the bias current, which is detected by the detection and comparison unit 130 in real time, of the power amplification unit 110 is greater than the reference current, the control unit 100 controls the bias current generation circuit 1401 to operate so as to generate an adjustment current (an adjustment current is output from the second half of FIG. 6). The adjustment current is output to the second bias circuit 1402 for providing a bias power supply for the second bias circuit 1402. Thus, the second bias circuit 1402 is controlled to generate a bias current which is provided for the corresponding amplification circuit so as to increase the gain of the power amplification unit 110, thereby compensating for the problem that the gain of the power amplification unit 110 is reduced as the output power of the power amplification unit 110 increases, and ensuring that the gain of the power amplification unit 110 operating at different powers is unchanged, so as to achieve the purpose of optimal linearity of a radio frequency front-end module.

When the bias current, which is detected by the detection and comparison unit 130 in real time, of the power amplification unit 110 is smaller than the reference current, it indicates that the gain of the power amplification unit 110 meets the requirements, the control unit 100 controls the bias current generation circuit 1401 to stop operating, i.e. stop outputting the adjustment current to the power amplification unit 110 (no adjustment current is output from the first half of FIG. 6).

Hereinafter, the case where the bias current, which is detected by the detection and comparison unit 130 in real time, of the power amplification unit 110 is greater than the reference current will be described in detail.

As shown in FIG. 4, the power amplification unit 110 includes two stages of amplification circuits 1101, and the case where the current acquisition circuit 1301 detects a bias current of the second stage of amplification circuit is taken as an example. When the current acquisition circuit 1301 detects in real time that the bias current of a first transistor HBT1 corresponding to the second stage of amplification circuit is greater than the reference current, the control unit 100 controls the bias current generation circuit 1401 to operate so as to generate an adjustment current which is output to the second bias circuit 1402 for providing a bias power supply for the second bias circuit 1402. Thus, the second bias circuit 1402 is controlled to generate a bias current which is provided for the first stage of amplification circuit so as to increase the gain of the power amplification unit 110.

Specifically, the current acquisition circuit 1301 detects a bias current of the first transistor HBT1 corresponding to the second stage of amplification circuit in real time, and the bias current increases as the input or output power of the power amplification unit 110 increases. For example, as shown in FIG. 7, the bias current of the second stage of amplification circuit increases with the increase of the input power of the power amplification unit 110, while the gain of the power amplification unit 110 is reduced with the increase of the output power thereof. Therefore, the bias current generation circuit 1401 may be used to generate an adjustment current and output the same to the second bias circuit 1402. The magnitude of the adjustment current generated by the bias current generation circuit 1401 is positively correlated to the bias current of the first transistor HBT1 of the second stage of amplification circuit. The bias current generated by the second bias circuit 1402 is provided for the first stage of amplification circuit, such that the gain of the power amplification unit 110 can be increased, thereby compensating for the problem that the gain of the power amplification unit 110 is reduced as the output power of the power amplification unit 110 increases, and ensuring that the gain of the power amplification unit 110 operating at different powers is unchanged, so as to achieve the purpose of optimal linearity of a radio frequency front-end module.

Figure 5:
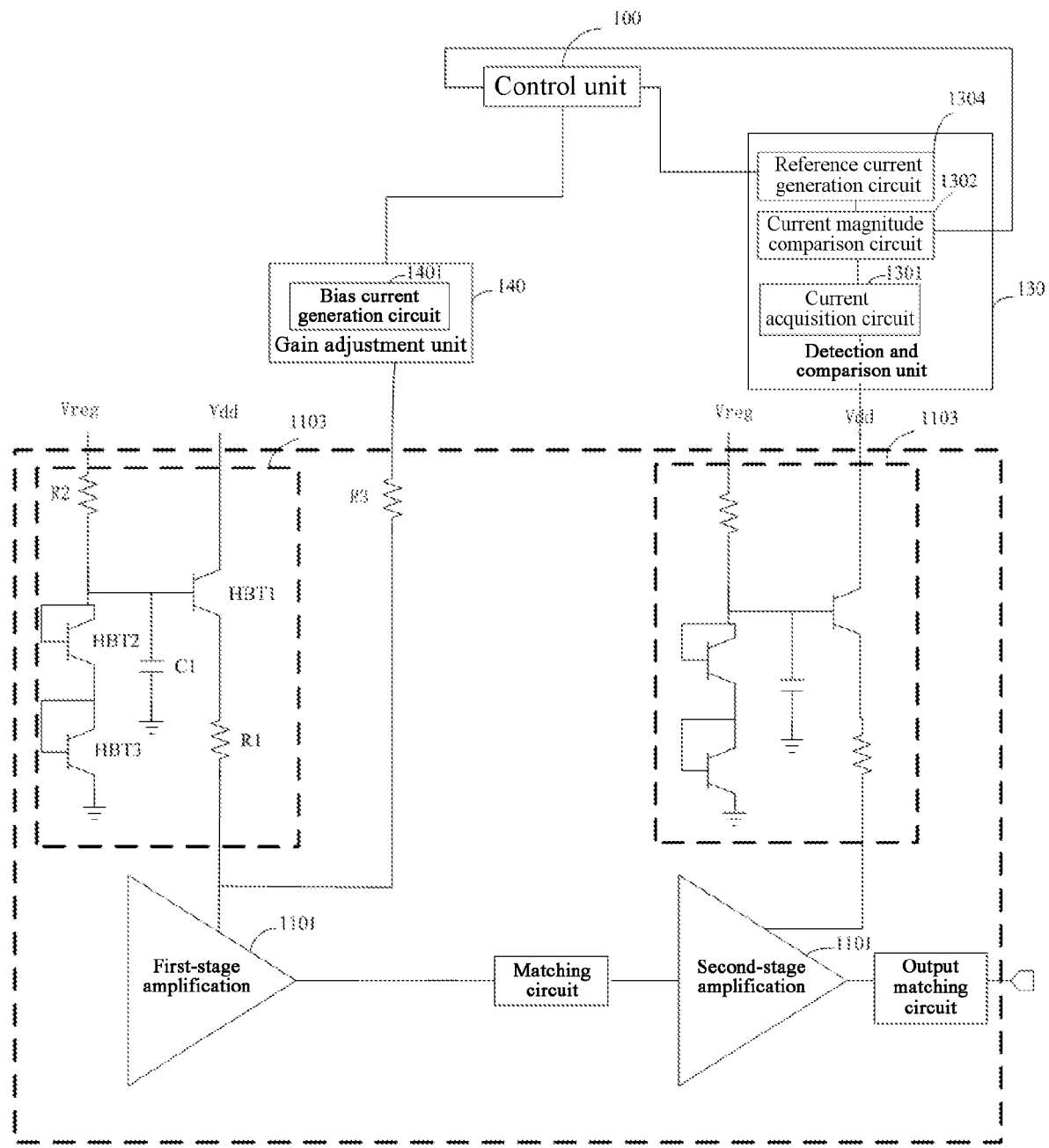
FIG. 5 is a schematic structural diagram of a third gain adjustment unit combined with a power amplification unit and a detection and comparison unit in a radio frequency power amplifier according to the present invention.

As shown in FIG. 5, in yet another embodiment of the present invention, the gain adjustment unit 140 includes a bias current generation circuit 1401 and a third resistor R3. An input end of the bias current generation circuit 1401 is connected to the control unit 100, an output end of the bias current generation circuit 1401 is connected to one end of the third resistor R3, and the other end of the third resistor R3 is connected to a bias end of any stage of amplification circuit adjacent to an amplification circuit to be detected. Alternatively, the other end of the third resistor R3 is connected to the bias end of the amplification circuit to be detected (in the case of only one amplification circuit).

Specifically, when the bias current, which is detected by the detection and comparison unit 130 in real time, of the power amplification unit 110 is greater than the reference current, the control unit 100 controls the bias current generation circuit 1401 to operate so as to generate an adjustment current (an adjustment current is output from the second half of FIG. 6). The adjustment current is output to the first stage of amplification circuit through the third resistor R3 so as to increase the gain of the power amplification unit 110, thereby compensating for the problem that the gain of the power amplification unit 110 is reduced as the output power of the power amplification unit 110 increases, and ensuring that the gain of the power amplification unit 110 operating at different powers is unchanged, so as to achieve the purpose of optimal linearity of a radio frequency front-end module. The third resistor R3 serves as a voltage divider for controlling a bias voltage input to the first amplification circuit to further ensure that the gain of the power amplification unit 110 increases within a preset range.

When the bias current, which is detected by the detection and comparison unit 130 in real time, of the power amplification unit 110 is smaller than the reference current, it indicates that the gain of the power amplification unit 110 meets the requirements, the control unit 100 controls the bias current generation circuit 1401 to stop operating, i.e. stop outputting the adjustment current to the power amplification unit 110 (no adjustment current is output from the first half of FIG. 6).

Hereinafter, the case where the bias current, which is detected by the detection and comparison unit 130 in real time, of the power amplification unit 110 is greater than the reference current will be described in detail.

As shown in FIG. 5, the power amplification unit 110 includes two stages of amplification circuits 1101, and the case where the current acquisition circuit 1301 detects a bias current of the second stage of amplification circuit is taken as an example. When the current acquisition circuit 1301 detects in real time that the bias current of a first transistor HBT1 corresponding to the second stage of amplification circuit is greater than the reference current, the control unit 100 controls the bias current generation circuit 1401 to operate so as to generate an adjustment current which is output to the first stage of amplification circuit through the third resistor R3 so as to increase the gain of the power amplification unit 110.

Specifically, the current acquisition circuit 1301 detects a bias current of the first transistor HBT1 corresponding to the second stage of amplification circuit in real time, and the bias current increases as the input or output power of the power amplification unit 110 increases. For example, as shown in FIG. 7, the bias current of the second stage of amplification circuit increases with the increase of the input power of the power amplification unit 110, while the gain of the power amplification unit 110 is reduced with the increase of the output power thereof. Therefore, the bias current generation circuit 1401 may be used to generate an adjustment current and output the same to the first stage of amplification circuit through the third resistor R3. The magnitude of the adjustment current generated by the bias current generation circuit 1401 is positively correlated to the bias current of the first transistor HBT1 of the second stage of amplification circuit. The gain of the power amplification unit 110 can be increased, thereby compensating for the problem that the gain of the power amplification unit 110 is reduced as the output power of the power amplification unit 110 increases, and ensuring that the gain of the power amplification unit 110 operating at different powers is unchanged, so as to achieve the purpose of optimal linearity of a radio frequency front-end module.

In the radio frequency power amplifier provided by the present invention, according to a function relationship between the gain of the power amplification unit and the output power of the power amplification unit in different frequency bands and different power level modes, the control unit adjusts a function relationship between an adjustment current generated by the gain adjustment unit and a bias current of the power amplification unit; then the detection and comparison unit compares the bias current, which is detected in real time, of the power amplification unit with a reference current; according to the comparison result, the control unit controls whether the gain adjustment unit needs to generate an adjustment current and output the same to the power amplification unit; thus, gain compensation of the power amplification unit in different modes is flexibly and effectively implemented, and the linearity index of a radio frequency front-end module is improved.

The radio frequency power amplifier provided by the present invention may be applied in a radio frequency front-end module. The radio frequency front-end module includes, but is not limited to, a Wifi radio frequency front-end module and a multi-mode multi-frequency radio frequency front-end module.

Figure 10:
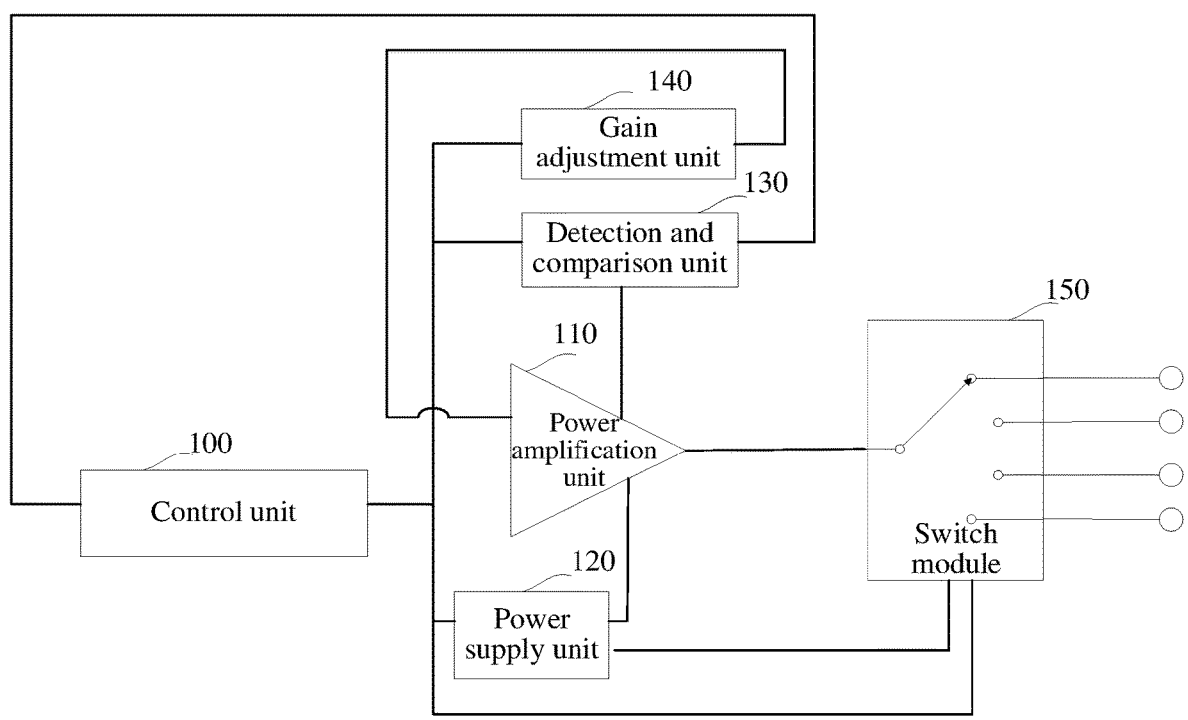
FIG. 10 is a schematic structural diagram of a radio frequency front-end module according to the present invention.

As shown in FIG. 10, the radio frequency front-end module may further include a switch unit 150 in addition to the radio frequency power amplifier. The switch unit 150 is connected to the control unit 100, the power supply unit 120 and the power amplification unit 110 of the radio frequency power amplifier respectively. A radio frequency signal amplified by the radio frequency power amplifier is transmitted to an antenna by the switch unit 150, and transmitted to a base station by the antenna, whereby the radio frequency front-end module transmits the radio frequency signal to the base station. The switch unit 150 may be implemented using a single-pole multi-throw switch or a multi-pole multi-throw switch. And an operation mode of the switch unit 150 and a switch state of an output port are controlled by the control unit 100.

When it is required to achieve bidirectional transmission of the radio frequency signal between the radio frequency front-end module and the base station, a low noise amplifier may also be disposed in the radio frequency front-end module. The low noise amplifier is connected to the switch unit. The radio frequency signal transmitted from the base station is power-amplified by the low noise amplifier and then transmitted to a transceiver for demodulation.

The radio frequency front-end module provided by the present invention may be used in a radio frequency chip. The specific structure of a radio frequency power amplifier in the radio frequency chip is not described in detail herein.

In addition, the above-mentioned radio frequency power amplifier/radio frequency front-end module may also be used in a communication terminal as an important component of a radio frequency circuit. As used herein, the communication terminal refers to a computer device that may be used in a mobile environment to support various communication standards such as GSM, EDGE, TD_SCDMA, TDD_LTE, or FDD_LTE, including but not limited to a mobile phone, a notebook computer, a tablet computer, an on-board computer, etc. In addition, the radio frequency power amplifier is also suitable for use in other communication technology applications, such as communication base stations compatible with a variety of communication standards, which are not described in detail herein.

The radio frequency power amplifier, the radio frequency front-end module, and the communication terminal provided in the present invention are described above in detail. For a person of ordinary skill in the art, any obvious change made to the present invention without departing from the essential content of the present invention shall fall within the protection scope of the patent of the present invention.

What is claimed is:

1. A radio frequency power amplifier comprising a control unit, a power amplification unit, a detection and comparison unit, and a gain adjustment unit, wherein an output end of the control unit is connected to input ends of the detection and comparison unit and the gain adjustment unit, a detection end of the power amplification unit is connected to the input end of the detection and comparison unit, an output end of the detection and comparison unit is connected to an input end of the control unit, and an output end of the gain adjustment unit is connected to a bias end of the power amplification unit;

the detection and comparison unit is configured to detect and compare a bias current of the power amplification unit with a reference current in real time, the control unit is configured to controls the gain adjustment unit to generate an adjustment current and output the same to the power amplification unit when the bias current of the power amplification unit is greater than the reference current, and control the gain adjustment unit to stop outputting an adjustment current to the power amplification unit when the bias current of the power amplification unit is smaller than the reference current, so as to ensure that the gain of the power amplification unit operating at different powers is not changed.

2. A communication terminal comprising the radio frequency power amplifier according to claim 1.

3. The radio frequency power amplifier according to claim 1, wherein the power amplification unit comprises at least one stage of amplification circuit, each stage of amplification circuit is connected to a first bias circuit respectively, when the power amplification unit comprises at least two stages of amplification circuits, the first bias circuit of any stage of amplification circuit is connected to the input end of the detection and comparison unit, and the output end of the detection and comparison unit is connected to a bias end of any stage of amplification circuit adjacent to this the stage of amplification circuit to be detected, through the gain adjustment unit controlled by the control unit;

when the power amplification unit comprises only one stage of amplification circuit, the first bias circuit of the amplification circuit is connected to the input end of the detection and comparison unit, and the output end of the detection and comparison unit is connected to the bias end of this stage of amplification circuit to be detected, through the gain adjustment unit controlled by the control unit.

4. The radio frequency power amplifier according to claim 3, wherein when the power amplification unit comprises at least two stages of amplification circuits, the various stages of amplification circuits are connected through an inter-stage matching circuit, an input end of the first stage of amplification circuit is connected to an output end of an input matching unit, and the last stage of amplification circuit is impedance-matched with an external antenna through an output matching circuit.

5. The radio frequency power amplifier according to claim 4, wherein the detection and comparison unit comprises a current acquisition circuit, a current magnitude comparison circuit, and a reference current generation circuit, an input end of the current acquisition circuit is connected to the bias circuit of any stage of amplification circuit, output ends of the current acquisition circuit and the reference current generation circuit are connected to an input end of the current magnitude comparison circuit, an output end of the current magnitude comparison circuit is connected to the input end of the control unit, and the output end of the control unit is connected to an input end of the reference current generation circuit.

6. The radio frequency power amplifier according to claim 5, wherein the gain adjustment unit comprises a bias current generation circuit;

when the power amplification unit comprises one stage of amplification circuit, an input end of the bias current generation circuit is connected to the control unit, and an output end of the bias current generation circuit is connected to a bias end of an amplification circuit to be detected;

when the power amplification unit comprises at least two stages of amplification circuits, the input end of the bias current generation circuit is connected to the control unit, and the output end of the bias current generation circuit is connected to a bias end of any stage of amplification circuit adjacent to the amplification circuit to be detected.

7. The radio frequency power amplifier according to claim 5, wherein the gain adjustment unit comprises a bias current generation circuit and a second bias circuit;

when the power amplification unit comprises one stage of amplification circuit, an input end of the bias current generation circuit is connected to the control unit, an output end of the bias current generation circuit is connected to an input end of the second bias circuit, and an output end of the second bias circuit is connected to a bias end of this stage of amplification circuit;

when the power amplification unit comprises at least two stages of amplification circuits, the input end of the bias current generation circuit is connected to the control unit, the output end of the bias current generation circuit is connected to the input end of the second bias circuit, and the output end of the second bias circuit is connected to a bias end of any stage of amplification circuit adjacent to the amplification circuit to be detected.

8. The radio frequency power amplifier according to claim 5, wherein the gain adjustment unit comprises a bias current generation circuit and a resistor;

when the power amplification unit comprises one stage of amplification circuit, an input end of the bias current generation circuit is connected to the control unit, an output end of the bias current generation circuit is connected to one end of the resistor, and the other end of the resistor is connected to a bias end of this stage of amplification circuit;

when the power amplification unit comprises at least two stages of amplification circuits, the input end of the bias current generation circuit is connected to the control unit, the output end of the bias current generation circuit is connected to one end of the resistor, and the other end of the resistor is connected to a bias end of any stage of amplification circuit adjacent to the amplification circuit to be detected.

9. The radio frequency power amplifier according to claim 1, further comprising a power supply unit, wherein an input end of the power supply unit is connected to the output end of the control unit, and an output end of the power supply unit is connected to a power supply end of the power amplification unit.

10. A radio frequency front-end module comprising the radio frequency power amplifier according to claim 1.

* * * * *